US009711615B2

(12) United States Patent
Nechay et al.

(10) Patent No.: US 9,711,615 B2
(45) Date of Patent: Jul. 18, 2017

(54) MULTICHANNEL DEVICES WITH IMPROVED PERFORMANCE AND METHODS OF MAKING THE SAME

(71) Applicants: Bettina A. Nechay, Lairei, MD (US); Shalini Gupta, Falls Church, VA (US); Matthew Russell King, Linthicum, MD (US); Eric J. Stewart, Silver Spring, MD (US); Robert S. Howell, Silver Spring, MD (US); Justin Andrew Parke, Ellicott City, MD (US); Harlan Carl Cramer, Columbia, MD (US); Howell George Henry, Ellicott City, MD (US); Ronald G. Freitag, Catonsville, MD (US); Karen Marie Renaldo, Pasadena, MD (US)

(72) Inventors: Bettina A. Nechay, Lairei, MD (US); Shalini Gupta, Falls Church, VA (US); Matthew Russell King, Linthicum, MD (US); Eric J. Stewart, Silver Spring, MD (US); Robert S. Howell, Silver Spring, MD (US); Justin Andrew Parke, Ellicott City, MD (US); Harlan Carl Cramer, Columbia, MD (US); Howell George Henry, Ellicott City, MD (US); Ronald G. Freitag, Catonsville, MD (US); Karen Marie Renaldo, Pasadena, MD (US)

(73) Assignee: Northrop Grumman Systems Corporation, Falls Church, VA (US)

(*) Notice: Subject to any disclaimer, the term of this patent is extended or adjusted under 35 U.S.C. 154(b) by 0 days.

(21) Appl. No.: 15/222,039

(22) Filed: Jul. 28, 2016

(65) Prior Publication Data

US 2016/0336425 A1    Nov. 17, 2016

Related U.S. Application Data

(62) Division of application No. 14/533,752, filed on Nov. 5, 2014, now Pat. No. 9,419,120.

(51) Int. Cl.
*H01L 29/06* (2006.01)
*H01L 29/66* (2006.01)
(Continued)

(52) U.S. Cl.
CPC .... *H01L 29/66462* (2013.01); *H01L 21/3065* (2013.01); *H01L 29/1029* (2013.01);
(Continued)

(58) Field of Classification Search
CPC .............. H01L 29/06; H01L 29/41766; H01L 29/66431; H01L 29/7783; H01L 29/7787
See application file for complete search history.

(56) References Cited

U.S. PATENT DOCUMENTS 7,692,298 B2    4/2010   Otsuka et al.
2002/0117681 A1* 8/2002  Weeks ................ H01L 29/0657
                                                            257/106
(Continued)

*Primary Examiner* — Phuc Dang
(74) *Attorney, Agent, or Firm* — Tarolli, Sundheim, Covell & Tummino LLP

(57) ABSTRACT

A transistor device is provided that comprises a base structure, and a superlattice structure overlying the base structure and comprising a multichannel ridge having sloping sidewalls. The multichannel ridge comprises a plurality of heterostructures that each form a channel of the multichannel ridge, wherein a parameter of at least one of the heterostructures is varied relative to other heterostructures of the plurality of heterostructures. The transistor device further comprises a three-sided gate contact that wraps around and substantially surrounds the top and sides of the multichannel ridge along at least a portion of its depth.

6 Claims, 8 Drawing Sheets

(51) Int. Cl.
*H01L 29/778* (2006.01)
*H01L 29/10* (2006.01)
*H01L 21/3065* (2006.01)
*H01L 29/205* (2006.01)
*H01L 29/20* (2006.01)

(52) U.S. Cl.
CPC ........ *H01L 29/1058* (2013.01); *H01L 29/205* (2013.01); *H01L 29/66431* (2013.01); *H01L 29/7783* (2013.01); *H01L 29/0657* (2013.01); *H01L 29/2003* (2013.01)

(56) References Cited

U.S. PATENT DOCUMENTS

| | | | |
|---|---|---|---|
| 2006/0249748 A1* | 11/2006 | Piner | H01L 21/0237 257/183 |
| 2011/0127581 A1 | 6/2011 | Bethoux et al. | |
| 2012/0217512 A1* | 8/2012 | Renaud | H01L 29/7787 257/76 |
| 2014/0110759 A1* | 4/2014 | Murata | H01L 29/7783 257/194 |
| 2015/0123215 A1 | 5/2015 | Obradovic et al. | |

* cited by examiner

MULTICHANNEL DEVICES WITH IMPROVED PERFORMANCE AND METHODS OF MAKING THE SAME

RELATED APPLICATIONS

This application is a divisional application of U.S. patent application Ser. No. 14/533752, filed 5 Nov. 2014, now U.S. Pat. No. 9,419,120, issued on 16 Aug. 2016, which is incorporated herein in its entirety.

TECHNICAL FIELD

The present invention relates generally to electronics, and more particularly to multichannel devices with improved performance and methods of making the same.

BACKGROUND

Certain heterostructure materials, such as Aluminum Gallium Nitride (AlGaN) and GaN, create an electron well (i.e., a sheet of electrons) at the interface between the two dissimilar materials resulting from the piezoelectric effect and spontaneous polarization effect therebetween. The resulting sheet of electrons that forms at this interface are typically referred to as a Two-Dimensional Electron Gas ("2DEG") channel. Equally applicable is a superlattice structure having a plurality of two-dimensional hole gas (2DHG) channels. Both types of structures can be referred to as "2D×G channel(s)" devices. FETs that operate by generating and controlling the electrons in the 2D×G channel are conventionally referred to as high electron mobility transistors ("HEMTs").

By stacking a plurality of these two-material heterostructures, and with the addition of appropriate doping in the layers to maintain the presence of the 2D×G channels when stacking a plurality of heterostructure layers, the electron sheets are able to act in parallel, allowing for greater current flow through the superlattice device. When this type of FET is "on", the superlattice device has a lower on-resistance, relative to a single heterostructure-layer device, because the multiple 2DEG channels allow a proportionally higher current to flow between the source and drain, resulting in an overall reduction in on-resistance. This type of structure has been well suited for providing an ultra low channel resistance high frequency switch.

In SLCFETs, multiple pairs of barrier and channel epitaxial layers are grown (e.g., AlGaN/GaN) to produce multiple conducting two dimensional electron gas (2DEG) channels. Due to difficulties in pinching these off from the top, the epitaxial is instead etched into ridges and pinched off via a gate contact from the sides. Due to limits imposed on both ridge width and sidewall slope by fabrication techniques, these FETs tend to show significantly higher pinch-off voltages and electric fields than do most standard, single channel, top pinching FETs. Specifically, for top pinching standard FETs, the gate is very close to the channel—typically on the order of 5-20 nanometers (nm), thus allowing small pinch-off voltages. However, for sidewall gates pinching-off etched ridges, distances from gate to the center of the ridge typically are below 100 nm—significantly increasing the necessary pinch-off voltage.

Though one would ideally want straight ridge sidewalls, typical limits in fabrication cause these ridges to be etched with sloped sidewalls instead of straight sidewalls. Such sidewall slopes lead to larger pinch-off voltages being required for the lower channels than for the upper channels because of their wider ridge widths. In the case of very shallow slopes, such non-uniformity in the pinch-off voltage can cause the lower channels to be too wide to pinch-off since the device will break down due to high electric fields at the edge of the sidewall gates before the high pinch-off voltage can be reached. Also, a non-uniform pinch-off voltage per channel means that channels that pinch-off early no longer contribute conduction current, thus increasing the on-state resistance from its optimal.

SUMMARY

In accordance with an example, a transistor device is provided that comprises a base structure, and a superlattice structure overlying the base structure and comprising a multichannel ridge having sidewalls. The multichannel ridge comprises a plurality of heterostructures that each form a channel of the multichannel ridge, wherein a parameter of at least one of the heterostructures is varied relative to other heterostructures of the plurality of heterostructures. The transistor device further comprises a gate contact that wraps around and substantially surrounds the top and at least one side of the multichannel ridge along at least a portion of its depth.

In accordance with another example, a super-lattice castellated gate heterojunction field effect transistor (SLCFET) is provided. The SLCFET comprises a base structure, and a superlattice structure overlying the base structure and comprising a plurality of multichannel ridges having sidewalls and being spaced apart from each other by non-channel openings. The multichannel ridge comprises a plurality of heterostructures that each form a portion of a channel of the SLCFET along with each other parallel heterostructures of the plurality of multichannel ridges, wherein a parameter of at least one of the parallel heterostructures of each of the multichannel ridges is varied. The SLCFET also comprises a gate contact that wraps around and substantially surrounds the top and sides of each the plurality of multichannel ridges along at least a portion of its depth and is interconnected together through the non-channel openings.

In yet another example, a method of forming a transistor device is provided. The method comprises forming a superlattice structure comprising a plurality of heterostructures over a base structure by sequentially depositing each layer of a plurality heterostructures over the base structure with one layer of each heterostructure being doped, and etching away openings in the superlattice structure over a channel region to form a castellated region in the channel region of alternating multichannel ridges with edges and non-channel openings, wherein a parameter of at least one corresponding parallel heterostructures of each of the multichannel ridges is varied. The method further comprises performing a gate contact fill process to form a gate contact that wraps around and substantially surrounds the top and sides of each the plurality of multichannel ridges along at least a portion of its depth and connects each one of the alternating multichannel bridges to one another through the non-channel openings.

DETAILED DESCRIPTION

Figure 1A:
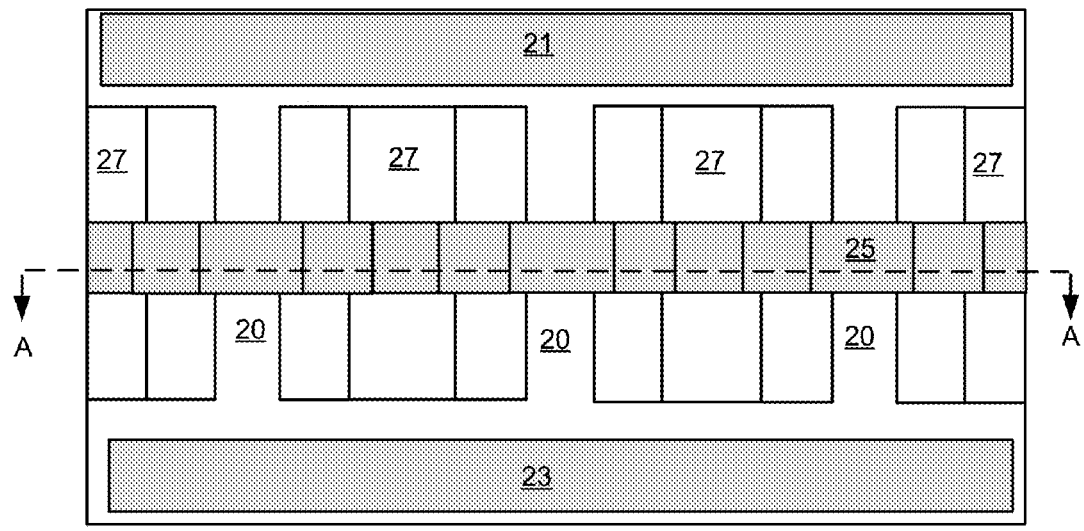
FIG. 1A illustrates a top plan view of an example of a SLCFET device structure.

Multichannel devices with improved performance are disclosed along with methods of making these multichannel devices. The techniques disclosed herein can provide for optimization of one or more device parameters such as, for example, the breakdown voltage, the pinch-off voltage, linearity and other device parameters. The device can be a side-pinching gate control contact multi-channel device, such as a super-lattice castellated gate heterojunction field effect transistor (SLCFET). The SLCFET can be used as low-loss switches for a variety of applications such as time delay units, low loss phase shifters and attenuators, switch matrices, T/R switches and circulator replacements or as amplifiers. Though such multi-channel devices offer low on-state resistance, pinch-off voltages can be very high with such side-pinching structures, such that the pinch-off voltages can be high enough to significantly limit the device breakdown voltage or prevent the device from pinching-off entirely.

The SLCFET is a solid-state RF switch technology that offers 2-3 times improvement in on-state resistance ($R_{on}$) versus conventional technology through the use of stacked semiconductor channels. However, SLCFET devices have limitations in their breakdown and pinch-off voltage due to the high electric fields inside the devices. The present techniques mitigate the problems associated with these high electric fields, and facilitate a SLCFET that successfully supports higher voltage and power modes of operation.

It is to be appreciated that the sidewall pinch-off voltage for a particular channel is dependent on the ridge width for that channel. Specifically, $V_{po} \sim N*W_{ridge}^2$ where, for that particular channel, $V_{po}$ is the pinch-off voltage, $W_{ridge}$ is the ridge width, and N is the channel carrier concentration which, for such SLCFETs is the two dimensional electron gas (2DEG) concentration. Though one would ideally want straight ridge sidewalls, typical limits in fabrication cause these ridges to be etched with sloped sidewalls instead of straight sidewalls. For example, the ridge width of a first channel can be over four times smaller than that of the sixth channel. Such sidewall slopes leads to larger pinch-off voltages being required for the lower channels than for the upper channels because of their wider ridge widths. In the case of very shallow slopes, such non-uniformity in the pinch-off voltage can cause the lower channels to be too wide to pinch-off since the device will break down due to high electric fields at the edge of the sidewall gates before the high pinch-off voltage can be reached. Also, a non-uniform pinch-off voltage per channel means that channels that pinch-off early no longer contribute conduction current, thus increasing the on-state resistance from its optimal.

In one example, a modulated doping technique is provided to optimize the pinch-off voltage of each of multiple 2DEG (two-dimensional electron gas) or 2DHG (two-dimensional hole gas) channels by varying the carrier concentration of the channels versus channel number within the multi-channel epitaxial stack to provide a substantially equal pinch-off voltage for each channel. Since such a side pinching device requires the etching of ridges into the multi-channel stack, variations in carrier concentration versus channel can compensate for a sloped sidewall profile that is introduced during etching. Tailoring can be adjusted for a fixed pinch-off voltage per channel, minimizing the specific on-resistance of the device for a given pinch-off voltage. Such modulated doping can alternately be used to optimize the linearity of the FET by tailoring the pinch-off profile for each channel, adding up to a more linear net transconductance. It is to be appreciated that the modulated doping can be employed to optimize other parameters of the multichannel device.

Figure 2:
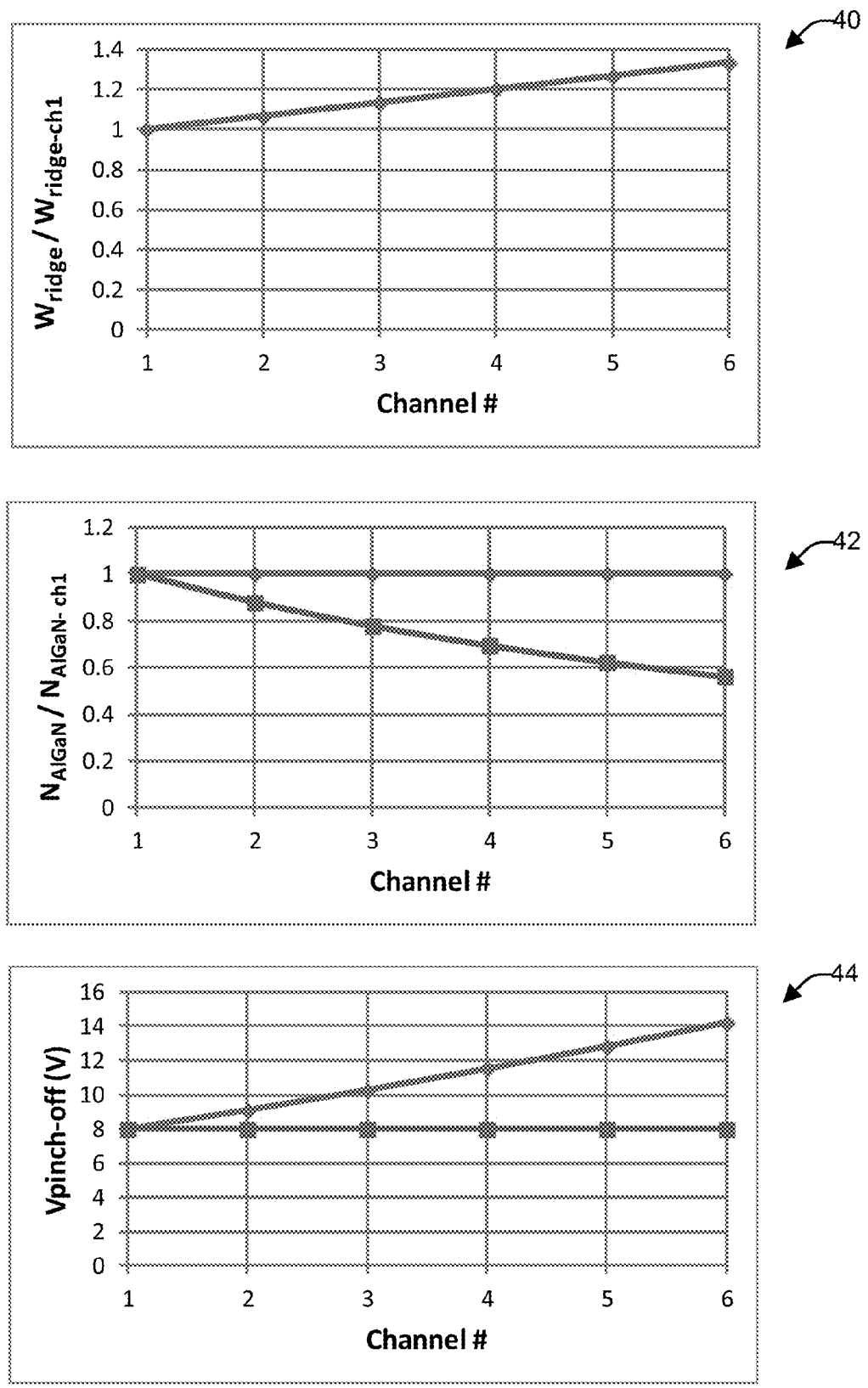
FIG. 2 illustrates a set of graphs that provide a comparison of a flat and modulated AlGaN barrier doping profiled, and its effect on pinch-off voltage.

As previously stated, the pinch-off voltage for a particular channel depends both on its width and on its carrier concentration (2DEG concentration). Therefore, the 2DEG concentration of the channel can be used as a second variable that can compensate for the widening ridge width in a particular channel in order to keep the pinch-off voltage constant for each channel. Alternatively, it can be used to determine an arbitrary profile for $V_{po}$ versus channel. This is graphically illustrated in FIG. 2, which illustrates a first graph 40 of width versus channel number. A second graph 42 illustrates a dopant concentration in the barrier layer versus channel number for both a uniform dopant concentration shown with solid dots and a modulated dopant concentration shown with solid boxes. It is to be appreciated that doping in the barrier layer gives rise to and is roughly proportional the 2DEG concentration. A third graph 44 compares the pinch-off voltage dependence versus channel for both a flat AlGaN barrier doping case (i.e. flat 2DEG concentration per channel shown with solid dots) and one which is scaled as $\sim W_{ridge}^{-2}$ in order to attain a roughly flat pinch-off profile (shown with solid boxes).

There are at least three purposes for which one can tailor the channel concentrations. The first, as stated, is to keep $V_{po}$ constant per channel. This minimizes the on-state resistance of the FET for a given pinch-off voltage. A second method is to tailor the channel concentrations to achieve a uniform breakdown voltage for each channel, thus minimizing the on-state resistance for a given breakdown voltage. A third approach is to tailor the channel concentration to achieve a more linear response of the FET by achieving a more linear transconductance versus gate voltage response. This is achieved by tailoring the carrier concentration of each channel to achieve a particular transconductance response for each channel which, when summed up, result in a net FET transconductance that is more linear. In practice, for GaN SLCFETs, the 2DEG concentration for the channels below the top channel is determined by the doping in the barrier layer (AlGaN). So, it is by grading the doping concentration of the barrier layers that one can achieve the desired $V_{po}$ profile.

Figure 3:
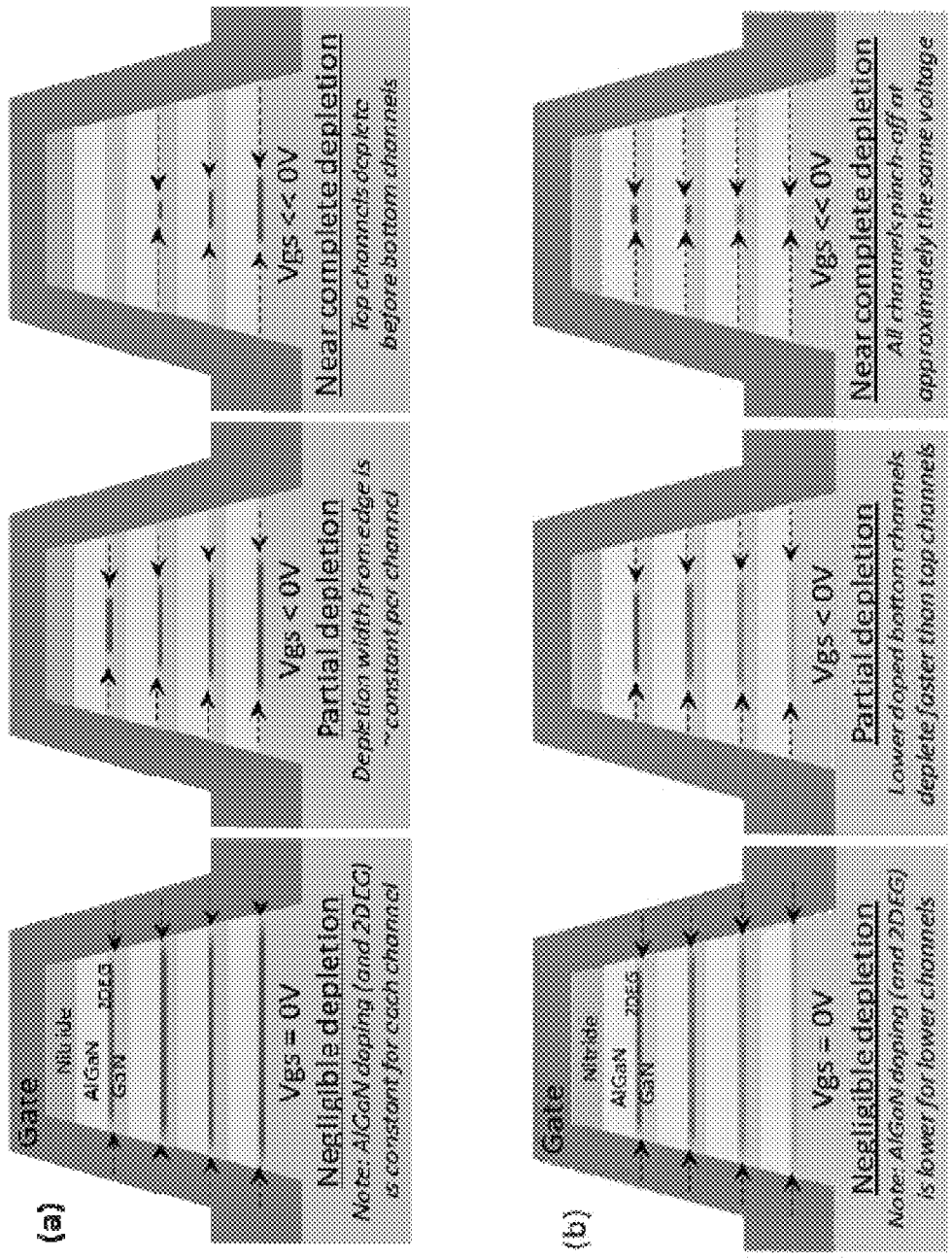
FIG. 3 illustrates multichannel ridge cross-sections showing (a) depletion of multiple channels for constant 2DEG concentration versus channel number, and (b) decreasing 2DEG concentration versus channel number.

The general effect of a uniform 2DEG concentration per channel profile on V po profile can be seen graphically in FIG. 3(a), which show cross sections of the ridge, with increasingly depleted 2DEG distributions as a function of gate bias for constant 2DEG concentration for each channel regardless of width. The general effect of 2DEG concentration profile on Vpo profile can be seen graphically in FIG. 3(b), which show cross sections of the ridge, with increasingly depleted 2DEG concentration distributions as a function of gate bias with decreasing doping concentration for increasing channel width.

Figure 4:
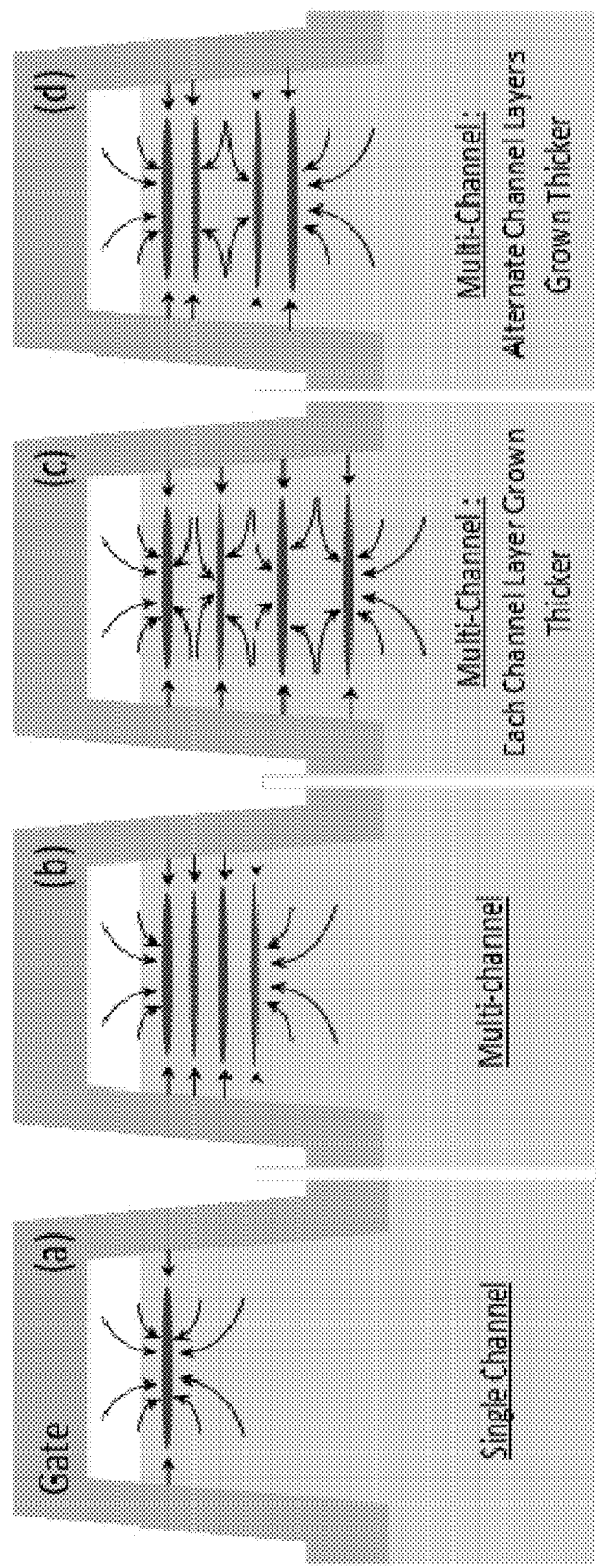
FIG. 4 illustrates a single channel ridge cross-section and a set of different thickness layered multichannel ridge cross-sections and the effects of fringing electric fields on these structures.

It is also to be appreciated that fringing electric fields caused by the applied voltage on the gate contact aids in the function of pinching off the device. However, free carriers through various channels in a multichannel superlattice structure can act as shields to block these fringing fields. Specifically, for the single channel stack shown in FIG. 4(a), the channel is depleted by both lateral fields from the side gate and by vertical components of fringing fields that are able to reach that channel. However, for the tightly spaced multi-channel stacks shown in FIG. 4(b), the helpful fringing fields are blocked from reaching the inner channels due to shielding caused by free carriers through the outer (top and bottom) channels. However, if one loosens the spacing between channels by thickening up the channel layers (thicker GaN in this example), then fringing fields can more easily penetrate into the ridge to aid in the pinch-off of inner channels as well, as illustrated in FIG. 4(c). Furthermore, it has been found from simulation that most of the pinch-off voltage benefit can be derived simply by growing thicker channel epitaxial for alternate channels, as illustrated in FIG. 4(d), as opposed to all channels. Since thicker epitaxial stack growth presents its own problems (both in the epitaxial growth and in subsequent fabrication), the alternate thicker layer epitaxial growth can mitigate these problems associated with the thicker epitaxial layers.

Therefore, in another example, a channel thickness variation technique is disclosed that involves thickening of various channel epitaxial layers to allow fringing electric fields to aid in the pinch-off of the device. These thickened channels can be each inner channel besides the top and bottom channels, or alternatively, every other inner channel besides the top and bottom channels. It can be further appreciated that either of the thickening of the channels techniques can be combined with the modulated doping technique.

Although these examples methods are illustrated with GaN SLCFETs, they are equally applicable to any other material system that can produce multiple channels perpendicular to the surface, and are equally applicable to any other side-pinching device for such a multi-channel stack.

These methods alone or in combination limit the voltage necessary to pinch-off the device while maintaining a low on-state resistance, and also enable the drain to be driven to higher voltages before breakdown. The modulated doping method can tailor the pinch-off voltages of individual channels to produce a fixed pinch-off voltage, which can minimize the on-state resistance for a given pinch-off voltage. Alternatively, non-uniform pinch-off voltages can be tailored for other uses, for example, to improve linearity. The second method, which uses thicker channel epitaxial method, is for reducing the pinch-off for channels near this epitaxial.

As an example, a SLCFET structure described herein includes a multichannel device composed of a plurality of aluminum gallium nitride (AlGaN)/gallium nitride (GaN) heterojunction layers of a prescribed thickness and composition, which is known as an AlGaN/GaN superlattice, formed on a single integrated circuit. A 2-dimensional electron gas (2DEG) forms at the interface between the AlGaN and GaN layers resulting in high electron mobility. Equally applicable is a superlattice structure having a plurality of two-dimensional hole gas (2DHG) channels. Both types of structures can be referred to as "2D×G channel(s)" devices.

Example methods of fabrication involve sequential growth of multichannel profiles in a monolithic epitaxial scheme. By sequentially growing the epitaxial multichannel devices, all devices fabricated from this structure will benefit from the inherently high quality material properties, atomically flat interfaces and compositional control associated with epitaxial growth.

Carriers which form a 2DEG in a standard channel of AlGaN/GaN are spontaneously generated and maintained due to piezoelectric and spontaneous polarization. In this case, the AlGaN barrier is strained by virtue of its epitaxial relationship with the GaN channel and since these materials are piezoelectric, free carriers are generated in the channel. Since carrier concentration in AlGaN/GaN heterostructures is controlled largely by the strain state of barrier and channel layers, the present examples disclose that the SLCFET structure can be created through precise control of composition, thickness and order of AlGaN and GaN layers. An epitaxial scheme and device fabrication method is provided that exploits this phenomenon which is unique to the GaN-based material system, and allows for fabrication of low loss RF switches.

Although the present example is illustrated with respect to employing a layer of AlGaN overlying a layer of GaN for each heterostructure, a variety of heterostructures could be employed as long as the heterostructure comprises two layers of dissimilar materials designed to create a sheet of electrons (i.e. a 2DEG channel) or a sheet of holes (i.e., a 2DHG channel) at the interface between the two dissimilar materials. Various heterostructure materials are known to produce 2DEG and 2DHG channels at the interface therebetween, including but not limited to Aluminum Gallium Nitride (AlGaN) and Gallium Nitride (GaN), Aluminum Gallium Arsenide (AlGaAs) and Gallium Arsenide (GaAs), Indium Aluminum Nitride (InAlN) and Gallium Nitride (GaN), alloys of Silicon (Si) and Germanium (Ge), and noncentrosymmetric oxidesheterojunction overlying a base structure.

It is to be appreciated that in a single heterostructure, the dissimilar materials cause an imbalance stress in the system which allows polarization and/or piezoelectric effects to induce carriers to form in a potential well formed by the heterostructure, i.e., to create a 2D×G channel. However, in a superlattice structure where multiple heterostructures are stacked on top of each other, all heterostructures beneath the top heterostructure will become balanced and carriers that would otherwise induce in those potential wells will not be induced. Adding a doping layer near the interface where the potential well is formed will act to induce the carriers into that potential well, replacing the effect that would have occurred but for the balancing effect of multiple symmetric heterostructures.

Although the examples herein are illustrated with respect to a three-sided gate, a two-sided gate that covers the top and at least one side of the gate could be employed. Additionally, a four-sided gate could be employed that covers the top, bottom and sides of portions of the multilayer epitaxial stack. It is further appreciated that a dielectric layer can be employed to provide an interface between the gate contact and the multilayer stack. It is yet further appreciated that modulating doping for one or more heterostructures of the superlattice structure can be employed for a variety of different reasons that are not illustrated or limited by the present examples. It is yet further appreciated that varying the thickness for one or more heterostructures of the superlattice structure can be employed for a variety of different reasons that are not illustrated or limited by the present examples.

Figure 1B:
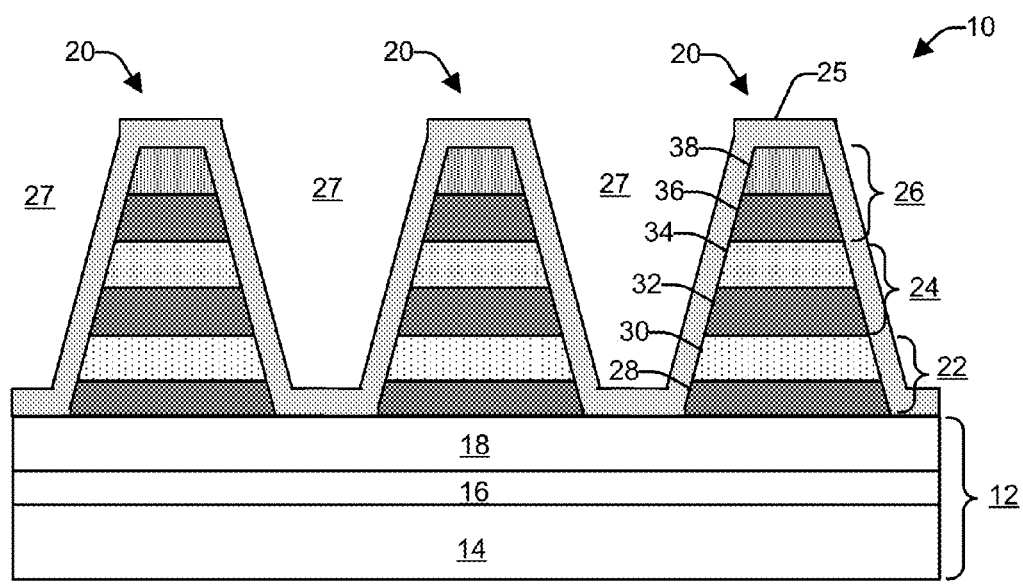
FIG. 1B illustrates a cross-sectional view of the example of the SLCFET device structure of FIG. 1A along the lines A-A.

FIG. 1A illustrates a top plan view of an example of a SLCFET device structure 10. FIG. 1B illustrates a cross-sectional view of the SLCFET device structure 10 of FIG. 1A along the lines A-A. The device structure 10 includes a castellated gate contact 25 that substantially surrounds three sides of a plurality of superlattice structure ridges (multichannel ridges) 20 formed from plurality of heterostructures of an AlGaN layer overlying a GaN layer, which are connected to one another through non-channel openings 27. The castellated gate contact 25 resides in between a drain contact 21 and a source contract 23. Each superlattice structure ridge 20 includes a first heterostructure 22 that overlies a base structure 12, a second heterostructure 24 that overlies the first heterostructure 22 and a third heterostructure 26 that overlies the second heterostructure 24. The first heterostructure 22 is formed of a first AlGaN layer 30 overlying a first GaN layer 28. The second heterostructure 24 is formed of a second AlGaN layer 34 overlying a second GaN layer 32. The third heterostructure 26 is formed of a third AlGaN layer 38 overlying a third GaN layer 36. Each parallel heterostructure, for example, first heterostructures 22 of each superlattice structure 20 form a first channel, second heterostructures 24 of each superlattice structure ridge 20 forms a second channel, and third heterostructures 26 of each superlattice structure ridge 20 form a third channel. Due to imperfect etching techniques, the width of each layer decreases from the first GaN layer 28 to the third AlGaN layer 38. This non-uniform width of the heterostructures gives rise to non-uniform pinch-off voltage characteristics in each channel.

The base structure 12 can comprise a substrate layer 14, a nucleation layer 16 and a buffer layer 18 of, for example, silicon carbide (SiC), aluminum nitride (AlN) and aluminum gallium nitride (AlGaN), respectively. Optionally, the base structure 12 can comprise a substrate layer 14 of sapphire, a nucleation layer 16 comprising a combination of a low-temperature GaN layer and a high-temperature GaN layer, and a buffer layer 18 based on the material of the superlattice structure to be located thereon, if required. The base structure 12 can alternatively comprise a substrate layer 14 of (111)-orientated crystalline silicon, a nucleation layer 16 comprising AlN and a buffer layer 18 comprising a series of discrete AlGaN layers (typically between two and eight layers), each discrete layer having a different aluminum composition. Other base structures will be apparent to those skilled in the art.

During the deposition, growth or other formation process of each AlGaN layer, a delta doping of an n-type dopant such as silicon (Si) can be added at the beginning of each of such AlGaN layers by introducing the dopant gas for a brief time interval, allowing the delta-doping for a confined thickness within the AlGaN layers to induce a 2DEG channel within each heterostructure. Similarly, a p-type dopant such as magnesium (Mg) could be introduced to induce a 2DHG channel in relevant heterostructures, as applicable. Other n-type and p-type dopants will be apparent to those skilled in the art. In one example, the delta-doping concentration is preferably between about $1E17\ cm^{-3}$ and about $1E20\ cm^{-3}$. Other doping profiles will be apparent to those skilled in the art.

In accordance with the example, of FIG. 1B, the doping is modulated or varied in concentration to provide for substantially equal pinch off for each channel. For example, the first AlGaN layer 30 of the first heterostructure 22 has a first dopant concentration, the second AlGaN layer 34 of the second heterostructure 24 has a second dopant concentration, and the third AlGaN layer 38 of the third heterostructure 26 has a third dopant concentration, wherein the third dopant concentration is greater than the second dopant concentration and the second dopant concentration is greater than the first dopant concentration. The higher the dopant concentration, the higher the carrier concentration in the given channel during operation. In this manner, since the pinchoff voltage depends on both carrier concentration and the ridge width, an increase in dopant concentration can be employed to compensate for narrow ridge widths, and a decrease in dopant concentration can be employed to compensate for wider ridge widths to substantially equalized pinch-off voltage for each channel.

In the example of FIG. 1B, each GaN layer of the heterostructures can have a thickness of about 5 nm to about 20 nm (e.g., 10 nm) and each AlGaN layer can have a thickness of about 5 nm to about 15 nm (e.g., 7 nm). The castellated gate contact 25 is formed in a central longitudinal portion of a channel region that extends along at least a portion of the depth of the plurality of superlattice structure ridges 20 formed between castellated trench openings 27 that form non-channel openings.

Although the superlattice structure ridges 20 are each illustrated as having three heterostructures, the superlattice structure ridges 20 can comprise a plurality of heterostructures, between 2 and N, wherein N is defined as the maximum number of heterostructures that can be grown, deposited or otherwise formed on each other without cracking or other mechanical failure in the layers or 2DEG channels. As will be appreciated by one skilled in the art, the value of N is a function of the specific heterostructure materials and thickness of each layer. The specific number of heterostructures within the superlattice structure and the heteromaterials can vary, and the relative positions of AlGaN and GaN may be reversed, as will be appreciated by one skilled in the art.

The percentage of aluminum in the AlGaN layers 30, 34 and 38 can range from about 0.1 to 100 percent. For example, the percentage of aluminum in the AlGaN layers can be between about 20% and 100% aluminum-content aluminum gallium nitride. The AlGaN layers can be graded or non-graded. In one example embodiment, each AlGaN layer within the multi-channel stack is graded, the term "graded" being used to denote the process of gradually changing the percentage of aluminum to its specified percentage, relative to the percentage of gallium, as known in the art.

As stated above, another method to reduce and/or control the pinch-off voltage of laterally pinching multi-channel epitaxial stacks is to increase the thickness of the middle channel epitaxial layers. This has the effect of allowing the fringing electric fields to penetrate into the interior of the ridge, as opposed to only the top and bottom channels in the example of FIG. 1B, thus aiding in pinch-off and reducing the overall pinch-off voltage.

Figure 5:
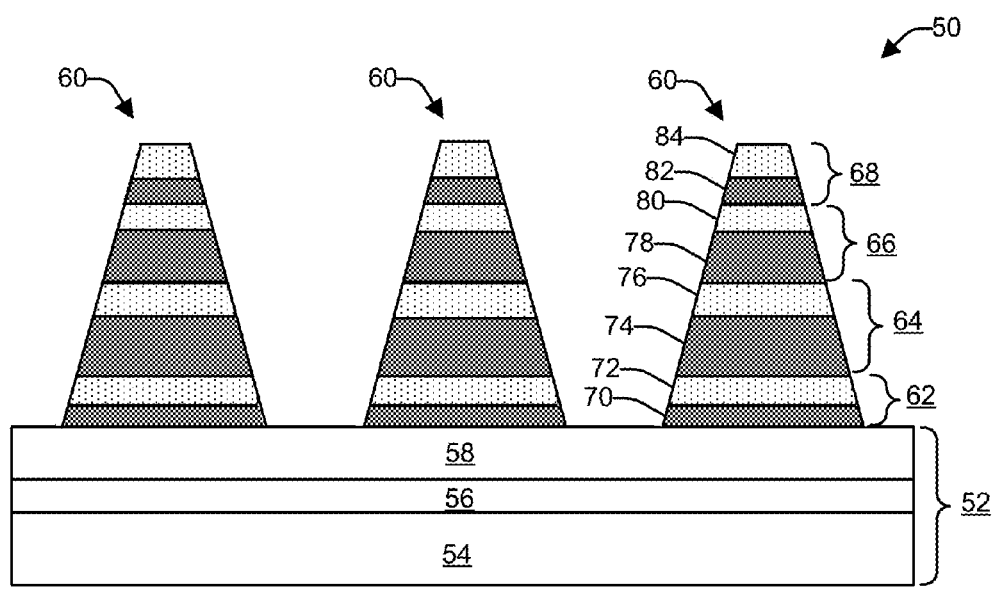
FIG. 5 illustrates a cross-sectional view of another example of a SLCFET device structure.

FIG. 5 illustrates a cross-sectional view of another example of a SLCFET device structure 50. The device structure 50 includes a castellated gate contact (not shown) that substantially surrounds three sides of a plurality of superlattice structure ridges (multichannel ridges) 60 formed from plurality of heterostructures of an AlGaN layer overlying a GaN layer. Each superlattice structure ridge 60 includes a first heterostructure 62 that overlies a base structure 52, a second heterostructure 64 that overlies the first heterostructure 62, a third heterostructure 66 that overlies the second heterostructure 64, and a fourth heterostructure 68 that overlies the third heterostructure 66. The first heterostructure 62 is formed of a first AlGaN layer 72 overlying a first GaN layer 70. The second heterostructure 64 is formed of a second AlGaN layer 76 overlying a second GaN layer 74. The third heterostructure 66 is formed of a third AlGaN layer 80 overlying a third GaN layer 78. The fourth heterostructure 68 is formed of a fourth AlGaN layer 84 overlying a fourth GaN layer 82. As stated above, the base structure 52 can comprise a base layer 54, a nucleation layer 56 and a buffer layer 58 formed of a variety of different materials as described above.

In accordance with the example of FIG. 5, during the deposition, growth or other formation process of each AlGaN layer, the doping is uniformly applied to each heterostructure. However the thickness of the middle heterostructures 64 and 66 of the superlattice structure ridges 60 are increased in thickness to facilitate the effect of allowing the fringing electric fields to penetrate into the interior of the ridges of the middle heterostructures 64 and 66, thus aiding in pinch-off and reducing the overall pinch-off voltage of the middle channels. In particular, the thickness of the second GaN layer 74 of the second heterostructure 64 and the thickness of the third GaN layer 78 of the third heterostructures 66 are increased relative to the thickness of the first GaN layer 70 of the first heterostructure 62 and the thickness of the fourth GaN layer 82 of the fourth heterostructure 68.

Figure 6:
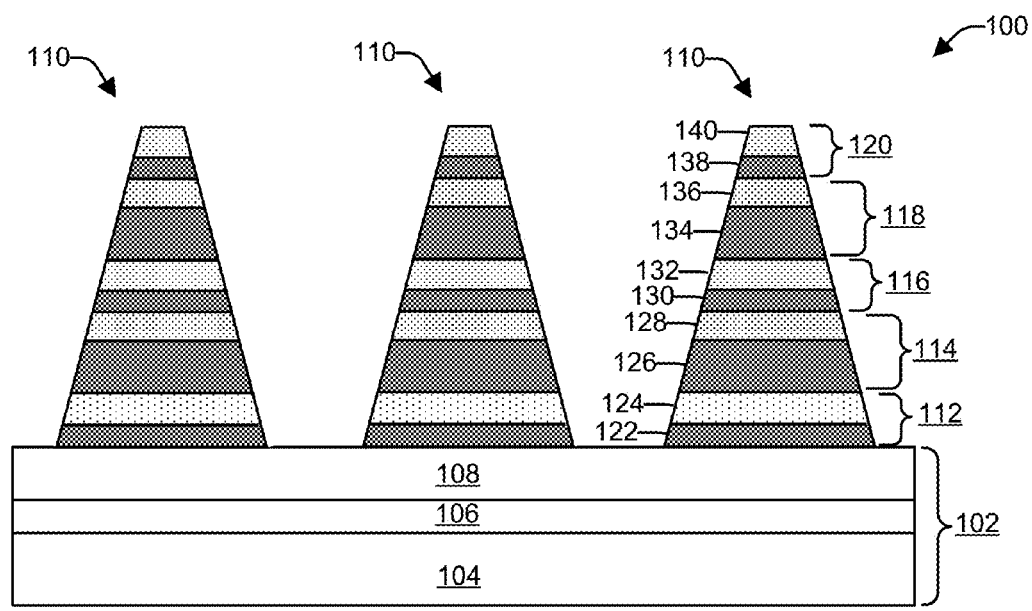
FIG. 6 illustrates a cross-sectional view of yet another example of a SLCFET device structure.

FIG. 6 illustrates a cross-sectional view of another example of a SLCFET device structure 100. The device structure 100 includes a castellated gate contact (not shown) that substantially surrounds three sides of a plurality of superlattice structure ridges (multichannel ridges) 110 formed from plurality of heterostructures of an AlGaN layer overlying a GaN layer. Each superlattice structure ridge 110 includes a first heterostructure 112 that overlies a base structure 102, a second heterostructure 114 that overlies the first heterostructure 112, a third heterostructure 116 that overlies the second heterostructure 114, a fourth heterostructure 118 that overlies the third heterostructure 116, and a fifth heterostructure 120 that overlies the fourth heterostructure 118. The first heterostructure 112 is formed of a first AlGaN layer 124 overlying a first GaN layer 122. The second heterostructure 114 is formed of a second AlGaN layer 128 overlying a second GaN layer 126. The third heterostructure 116 is formed of a third AlGaN layer 132 overlying a third GaN layer 130. The fourth heterostructure 118 is formed of a fourth AlGaN layer 136 overlying a fourth GaN layer 134. The fifth heterostructure 120 is formed of a fifth AlGaN layer 140 overlying a fifth GaN layer 138. As stated above, the base structure 102 can comprise a base layer 104, a nucleation layer 106 and a buffer layer 108 formed of a variety of different materials as described above.

In accordance with the example of FIG. 6, during the deposition, growth or other formation process of each AlGaN layer, the doping is uniformly applied to each heterostructure. However the thickness of every other middle heterostructure 114 and 118 of each of the superlattice structure ridges 110 are increased in thickness to facilitate the effect of allowing the fringing electric fields to penetrate into the interior of the ridges, of the middle channels formed from the middle heterostructures 114, 116 and 118, thus aiding in pinch-off and reducing the overall pinch-off voltage. In particular, the thickness of the second GaN layer 126 of the second heterostructure 114 and the thickness of the fourth GaN layer 134 of the fourth heterostructures 118 are increased relative to the thickness of the first GaN layer 122 of the first heterostructure 112, the thickness of the third GaN layer 130 of the third heterostructure 116 and the thickness of the fifth GaN layer 138 of the fifth heterostructure 120. It is to be noted that in the every other thicker GaN layer example, the fringing fields are added from one side for each channel, while the every thicker GaN layer example, the fringing fields are added on both sides of each channel.

Figure 7:
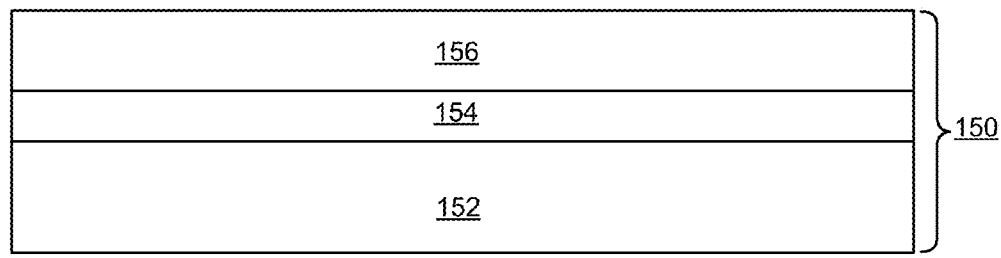
FIG. 7 illustrates a cross-sectional view of an epitaxial structure in its early stages of fabrication.

Turning now to FIGS. 7-13, an example fabrication is discussed in connection with formation of the example of a SLCFET device structure that utilizes a combination of the techniques discussed in FIGS. 1-6, such that the resultant structure has both a thicker middle layer to facilitate the utilization of fringing fields, and modulated doping concentrations for each channel based on channel width. FIG. 7 illustrates a cross-sectional view of an epitaxial structure in its early stages of fabrication. The epitaxial structure includes a base structure 150. As stated above, the base structure 150 can comprise a base layer 152, a nucleation layer 154 and a buffer layer 156 formed of a variety of different materials as described above.

FIG. 7 also illustrates the structure after undergoing an epitaxial growth process to form a first heterostructure 157 over the base structure 150. The first heterostructure 157 is formed of an AlGaN layer 162 overlying a GaN layer 158. The GaN layer 158 is deposited over the base structure 150 and the AlGaN layer 162 is deposited over the GaN layer 158. Any suitable technique for depositing each layer can be employed such as metal organic chemical vapor deposition (MOVCD), molecular beam epitaxy (MBE) or other suitable deposition techniques. The AlGaN layer 162 is doped with a dopant to induce carriers and replacing the effect that would have occurred but for the balancing effect of multiple symmetric heterostructures. The dopant is selected to provide the AlGaN layer 162 with a first doping concentration based on the resultant thicker width of the first heterostructure relative to overlying heterostructures after a subsequent etch to form superlattice heterostructure ridges. The resultant structure is illustrated in FIG. 8.

Figure 8:
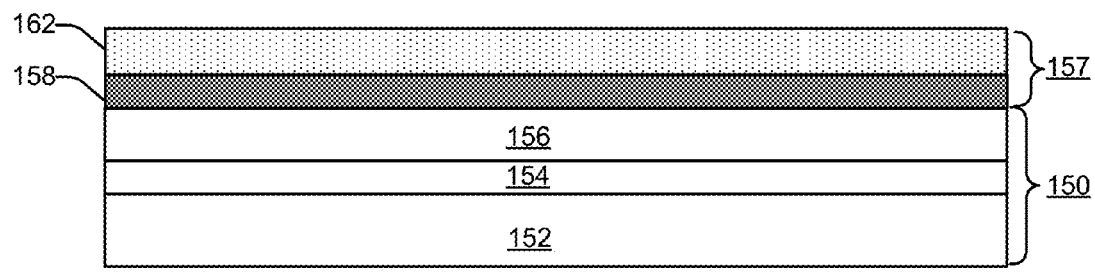
FIG. 8 illustrates a cross-sectional view of the structure of FIG. 7 after undergoing an epitaxial growth process.
Figure 9:
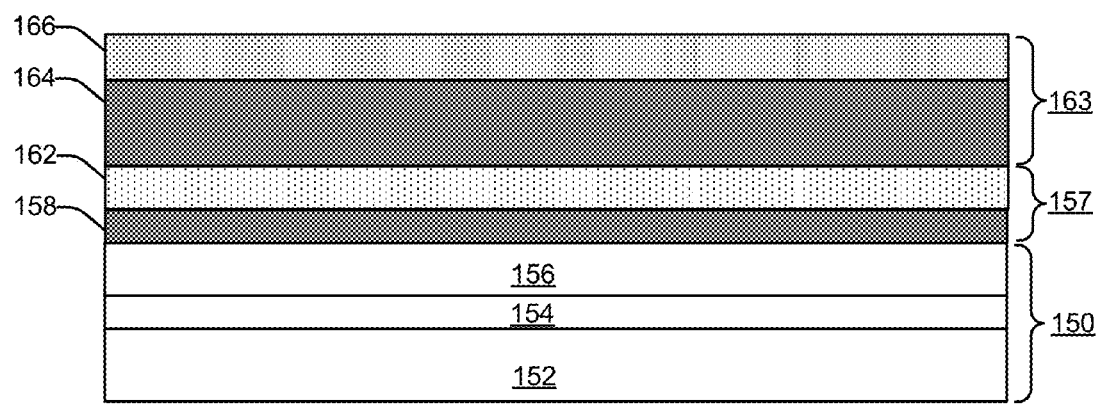
FIG. 9 illustrates a cross-sectional view of the structure of FIG. 8 after undergoing another epitaxial growth process.
Figure 10:
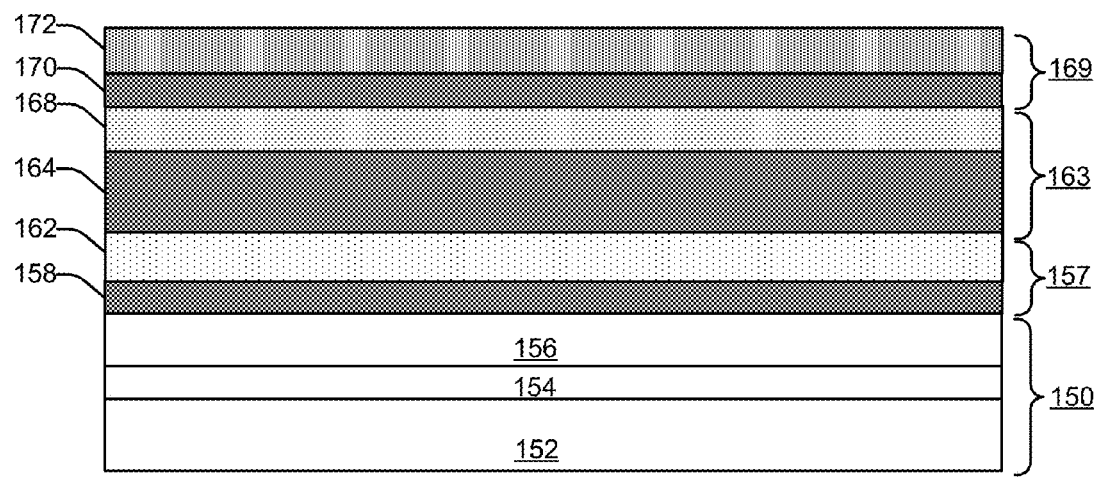
FIG. 10 illustrates a cross-sectional view of the structure of FIG. 9 after undergoing yet another epitaxial growth process.

FIG. 9 illustrates the structure of FIG. 8 after a second heterostructure 163 is formed over the first heterostructure 157. The second heterostructure 163 is formed of an AlGaN layer 166 overlying a GaN layer 164. However, the GaN layer 164 is of a greater thickness than the GaN layer 158 of the first heterostructure 157 to facilitate effect of allowing the fringing electric fields to penetrate into the interior of the ridges of the middle channel formed by the second heterostructure 163, thus aiding in pinch-off and reducing the overall pinch-off voltage associated with the second heterostructure 163. The AlGaN layer 166 is doped with a dopant to induce carriers and replace the effect that would have occurred but for the balancing effect of multiple symmetric heterostructures. The dopant is selected to provide the AlGaN layer 166 with a second doping concentration that is greater than the first doping concentration based on the resultant shorter width of the second heterostructure 163 relative to the underlying first heterostructure 157 after a subsequent etch to form superlattice ridges. The resultant structure is illustrated in FIG. 10. The dots of the doped AlGaN layer 168 of the second heterostructure 163 are increased in density relative to the dots in the AlGaN layer 162 of the first heterostructure 157 to show the increase in doping concentration.

It should be noted that for illustrative purposes, the bottom GaN is shown as being thinner than the thicker GaN. However, in practice, a back barrier structure of about 50 nm GaN is below the bottom AlGaN barrier followed by a 4% AlGaN back barrier underneath that to prevent current leakage under the gated ridges.

FIG. 10 illustrates the structure of FIG. 9 after a third heterostructure 169 is deposited over the second heterostructure 163. The third heterostructure 169 is formed of an AlGaN layer 172 overlying a GaN layer 170. However, the GaN layer 170 of the third heterostructure 169 has relatively the same thickness of the GaN layer 158 of the first heterostructure 157 since fringing fields are not blocked on a top of the third heterostructure 169 and a bottom of the first heterostructure 157. The AlGaN layer 172 is doped with a dopant to induce additionally carriers and replace the effect that would have occurred but for the balancing effect of multiple symmetric heterostructures. The dopant is selected to provide the AlGaN layer 172 with a third doping concentration that is greater than the second doping concentration and greater than the first doping concentration based on the resultant shorter width of the third heterostructure 169 relative to the underlying second heterostructure 163 and the underlying first heterostructure 157. The dots of the doped AlGaN layer 172 of the third heterostructure 169 are increased in density relative to the dots in the AlGaN layer 168 of the second heterostructure 163 to show the increase in doping concentration.

Figure 11:
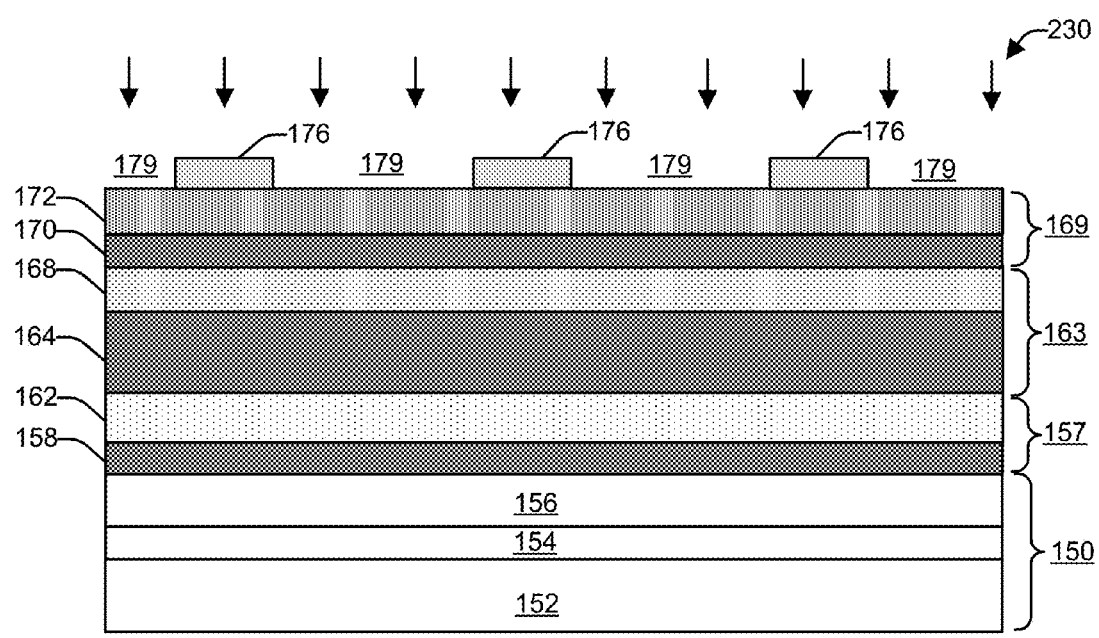
FIG. 11 illustrates a cross-sectional view of the structure of FIG. 10 after formation of an etch mask and while undergoing an etch process.

As illustrated in the cross-sectional view of FIG. 11, an etch mask 176 is formed over the superlattice structure formed from the first, second and third heterostructures 157, 163, and 169, respectively. The etch mask 176 can be formed by depositing, patterning and developing a photoresist material layer over the superlattice structure, depositing a hard mask material, such as for example, a thick layer of metal (e.g., nickel) (about 300 Å) or the like in the patterned openings, and then removing the photoresist material layer to leave a resultant hard mask. The hard mask 176 provides covered regions that protect underylying areas of the superlattice structure, where the multi-ridge multi-channels will reside, and also covered regions that protect the source and drain regions (not shown). The mask 176 also includes openings 179 over the superlattice structure exposing a top layer of AlGaN 172 for forming underlying castellated non-channel openings 181 (see FIG. 12). Alternatively, a hard mask material such as an insulator material (e.g., silicon oxide ($SiO_2$), silicon nitride (SiN), etc.) can be deposited over the superlattice structure followed by a depositing and patterning of photoresist material with a subsequent etching of the insulator material and stripping of the photoresist material to form the resultant mask 176.

FIG. 11 illustrates performing of an etch 230 (e.g., anisotropic reactive ion etching (RIE)) to remove portion of the superlattice structure under the openings 179 in the etch mask 176 for forming extended openings 181 (FIG. 12) in the superlattice structure down to the base structure 150. The etch step 230 can be a dry etch that employs an etchant which selectively etches the material of the supperlatice structure at a faster rate than the underlying base structure 150 and the overlying etch mask 176. For example, the supperlattice structure may be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the etch mask 176 to thereby remove portion of the superlattice structure down to the base structure 150 leaving a plurality of multichannel ridges 180. Alternatively, the etching process 230 can include etching the channel region by an inductively coupled plasma (ICP) etcher to form "castellations" in the form of a plurality of multichannel ridges 180 and non-channel openings 181. The etch mask 176 is stripped to provide the resultant structure of FIG. 12. As previously stated, limits in fabrication cause these ridges 180 to be etched with sloped sidewalls instead of straight sidewalls.

Figure 12:
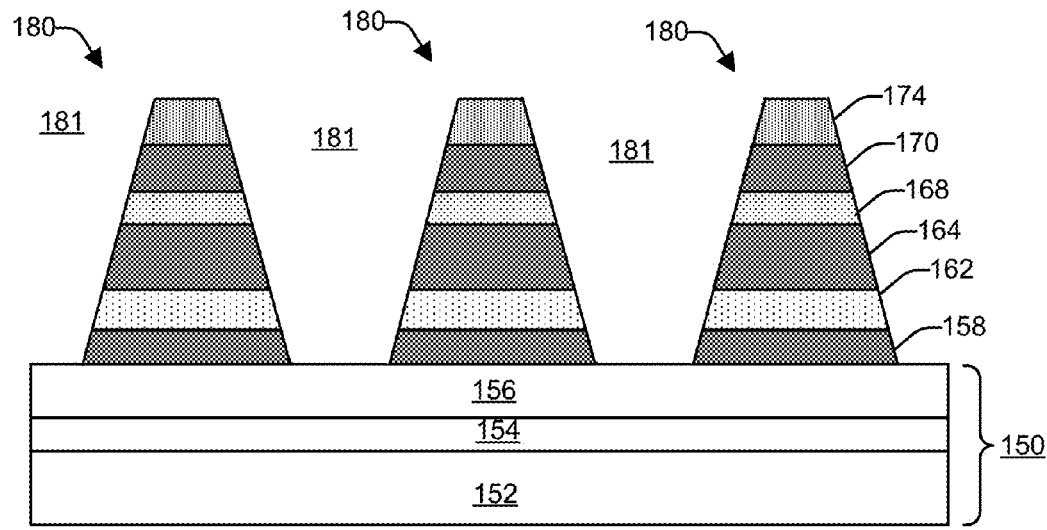
FIG. 12 illustrates a cross-sectional view of the structure of FIG. 11 after undergoing the etch process and after the stripping of the etch mask.
Figure 13:
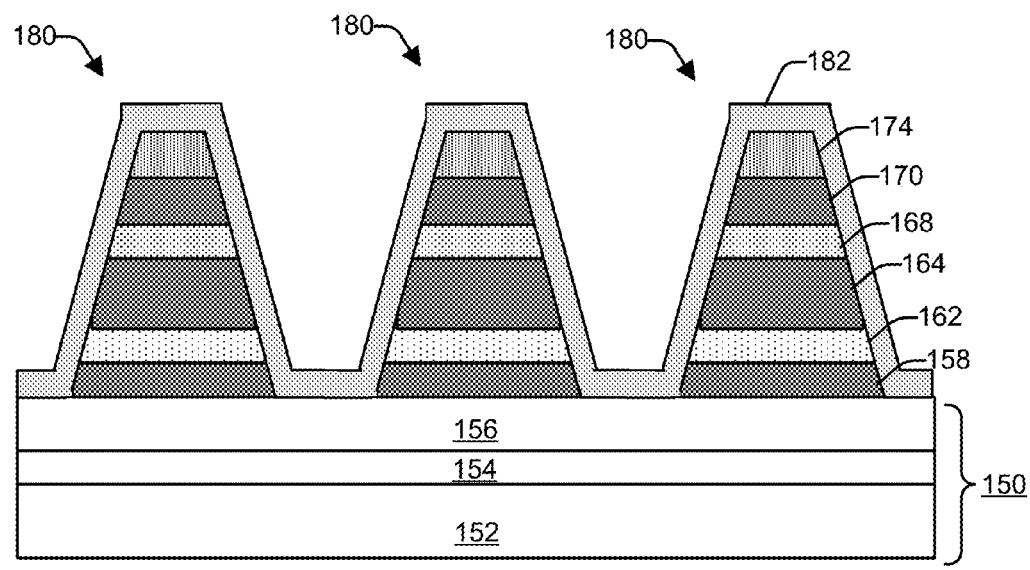
FIG. 13 illustrates a cross-sectional view of the structure of FIG. 12 after undergoing a gate contact fill process.

FIG. 13 provides a cross-sectional view of the structure of FIG. 12 after undergoing a gate contact fill deposition along the longitudinal opening with a conductive material to form three sided gate contact 182 that wraps around and substantially surrounds three sides of each of the plurality of multichannel ridges 180. Optionally, a dielectric layer can be deposited that wraps around and surrounds the three sides of each of the plurality of multichannel ridges 180 along at least a portion of their lengths prior to the gate contact fill to facilitate the reduction in leakage current by the resultant device structures. Alternatively, the gate contact material can be deposited over the entire structure and etched away everywhere but over the longitudinal opening. The gate contact fill deposition can be an atomic layer deposition or other deposition technique conducive to depositing into trench openings and undercut openings. The gate contact 182 can be made of a conventional contact material comprising layers of nickel and gold, as known in the art. Other gate contacts compositions will be apparent to those skilled in the art. Subsequently or concurrently drain and source contacts can be formed, and an overlying passivation layer deposited over the final structure to form the final integrated SLFET device.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:
1. A method of forming a transistor device, the method comprising:
  forming a superlattice structure comprising a plurality of heterostructures over a base structure by sequentially depositing each layer of the plurality of heterostructures over the base structure with one layer of each heterostructure being doped;
  etching away openings in the superlattice structure over a channel region to form a castellated region in the channel region of alternating multichannel ridges with edges and nonchannel openings, wherein a parameter of at least one of corresponding parallel heterostructures of each of the alternating multichannel ridges is varied; and performing a gate contact fill process to form a gate contact that wraps around and substantially surrounds the top and sides of each the alternating multichannel ridges along at least a portion of its depth and connects each one of the alternating multichannel ridges to one another through the non-channel openings.

2. The method of claim 1, wherein the parameter is a dopant concentration.

3. The method of claim 1, wherein the parameter is a dopant concentration for each heterostructure, such that longer width channels associated with a given heterostructure are doped with less dopant concentration than shorter width channels associated with a given heterostructure for each of the plurality of heterostructures to substantially equalize the pinch-off voltage of each channel of the SLCFET during operation.

4. The method of claim 1, wherein the parameter is a thickness.

5. The method of claim 1, wherein the parameter is a thickness, such that each inner heterostructure is formed with a greater thickness than a thickness of at least one of a top heterostructure and a bottom heterostructure for each of the alternating multichannel ridges.

6. The method of claim 1, wherein the parameter is a thickness, such that every other inner heterostructure is formed with a greater thickness than a thickness of at least one of a top heterostructure and a bottom heterostructure for each of the alternating multichannel ridges.

\* \* \* \* \*

UNITED STATES PATENT AND TRADEMARK OFFICE
CERTIFICATE OF CORRECTION

PATENT NO. : 9,711,615 B2
APPLICATION NO. : 15/222039
DATED : July 18, 2017
INVENTOR(S) : Bettina A. Nechay et al.

Page 1 of 1

It is certified that error appears in the above-identified patent and that said Letters Patent is hereby corrected as shown below:

In the Claims

Column 13, Line 6 reads "of each the" should read --of each of the--

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*